US008379376B2

(12) United States Patent
Nehete et al.

(10) Patent No.: US 8,379,376 B2
(45) Date of Patent: Feb. 19, 2013

(54) HEAT MANAGEMENT AND REDUCTION OF HIGH TEMPERATURES EXPOSURE TO COMPONENTS INSIDE ENERGY METER

(75) Inventors: Chandrashekhar Sadashiv Nehete, Maharashtra (IN); Sandeep Yograj Nemade, Andhra Pradesh (IN)

(73) Assignee: General Electric Company, Schenectady, NY (US)

( * ) Notice: Subject to any disclaimer, the term of this patent is extended or adjusted under 35 U.S.C. 154(b) by 237 days.

(21) Appl. No.: 12/858,692

(22) Filed: Aug. 18, 2010

(65) Prior Publication Data

US 2012/0044643 A1  Feb. 23, 2012

(51) Int. Cl.
*H05K 7/20* (2006.01)
*F28D 15/00* (2006.01)

(52) U.S. Cl. ........ 361/678; 361/359; 361/664; 361/667; 361/694; 165/104.33

(58) Field of Classification Search .......... 361/659–672, 361/676–678, 688, 694; 324/74, 110, 142; 29/592.1; D10/100; 165/104.33
See application file for complete search history.

(56) References Cited

U.S. PATENT DOCUMENTS

| 1,898,634 | A | * | 2/1933 | Lewis | 361/663 |
|---|---|---|---|---|---|
| 1,969,499 | A | * | 8/1934 | Bradshaw et al. | 324/156 |
| 2,320,946 | A | * | 6/1943 | Madden | 324/156 |
| 3,397,346 | A | * | 8/1968 | Sloop | 361/666 |
| 4,025,825 | A | * | 5/1977 | Shrader | 361/670 |
| 4,226,102 | A | * | 10/1980 | Mattress, Jr. | 70/164 |
| 4,792,677 | A | * | 12/1988 | Edwards et al. | 250/231.13 |
| 5,001,420 | A | * | 3/1991 | Germer et al. | 324/142 |
| 5,033,973 | A | * | 7/1991 | Pruehs et al. | 439/167 |
| 5,041,001 | A | * | 8/1991 | Giles | 439/189 |
| 5,097,383 | A | * | 3/1992 | Heard et al. | 361/662 |
| 5,173,657 | A | * | 12/1992 | Holdsclaw | 324/142 |
| 5,216,802 | A | * | 6/1993 | Cole et al. | 29/825 |
| 5,270,639 | A | * | 12/1993 | Moore | 324/142 |
| 5,404,266 | A | * | 4/1995 | Orchard et al. | 361/667 |
| 5,503,271 | A | * | 4/1996 | Lynch | 206/305 |
| 5,546,269 | A | * | 8/1996 | Robinson et al. | 361/660 |
| 5,572,396 | A | * | 11/1996 | Robinson | 361/117 |
| 5,774,328 | A | * | 6/1998 | Rector et al. | 361/667 |
| 5,966,010 | A | * | 10/1999 | Loy et al. | 324/142 |
| 5,994,892 | A | * | 11/1999 | Turino et al. | 324/142 |
| 5,997,347 | A | * | 12/1999 | Robinson et al. | 439/517 |
| 6,476,595 | B1 | * | 11/2002 | Heuell et al. | 324/142 |
| 6,545,374 | B1 | * | 4/2003 | Allenbach | 307/125 |
| 6,589,072 | B2 | * | 7/2003 | Robinson et al. | 439/517 |
| 6,605,937 | B2 | * | 8/2003 | Germer et al. | 324/157 |

(Continued)

FOREIGN PATENT DOCUMENTS

EP  1538449 A2 *  6/2005
WO  WO 02088642 A1 *  11/2002

(Continued)

*Primary Examiner* — Anatoly Vortman
(74) *Attorney, Agent, or Firm* — Ernest G. Cusick; Frank A. Landgraff

(57) ABSTRACT

Electronic components of an energy meter are mounted in an encapsulated compartment within a sealed outer enclosure of the meter. The encapsulated compartment is advantageously positioned to form air channels between the encapsulated compartment and the sealed outer enclosure to deliver thermal air circulation there-between to promote sufficient heat transfer through an outer skin of the sealed outer enclosure for maintaining acceptable thermal conditions for the encapsulated electronic components.

13 Claims, 3 Drawing Sheets

U.S. PATENT DOCUMENTS

| | | | | |
|---|---|---|---|---|
| 6,687,627 B1 * | 2/2004 | Gunn et al. | | 702/61 |
| 6,734,663 B2 * | 5/2004 | Fye et al. | | 324/142 |
| 6,754,067 B2 * | 6/2004 | Turner et al. | | 361/659 |
| 6,773,652 B2 * | 8/2004 | Loy et al. | | 264/274 |
| 6,798,191 B1 * | 9/2004 | Macfarlane et al. | | 324/157 |
| 6,838,867 B2 * | 1/2005 | Loy | | 324/142 |
| 6,940,711 B2 * | 9/2005 | Heuell et al. | | 361/668 |
| 6,956,733 B2 * | 10/2005 | Beasley et al. | | 361/641 |
| 7,084,783 B1 * | 8/2006 | Melvin et al. | | 340/870.02 |
| 7,265,532 B2 * | 9/2007 | Karanam et al. | | 324/142 |
| 7,397,652 B2 * | 7/2008 | Price et al. | | 361/643 |
| 7,471,516 B2 | 12/2008 | Voisine | | |
| 7,540,766 B2 * | 6/2009 | Makinson et al. | | 439/517 |
| 7,656,649 B2 * | 2/2010 | Loy et al. | | 361/659 |
| 2005/0270016 A1 * | 12/2005 | Karanam et al. | | 324/157 |
| 2006/0158177 A1 * | 7/2006 | Ramirez | | 324/142 |

FOREIGN PATENT DOCUMENTS

WO     WO 2005001994 A2 *   1/2005

* cited by examiner

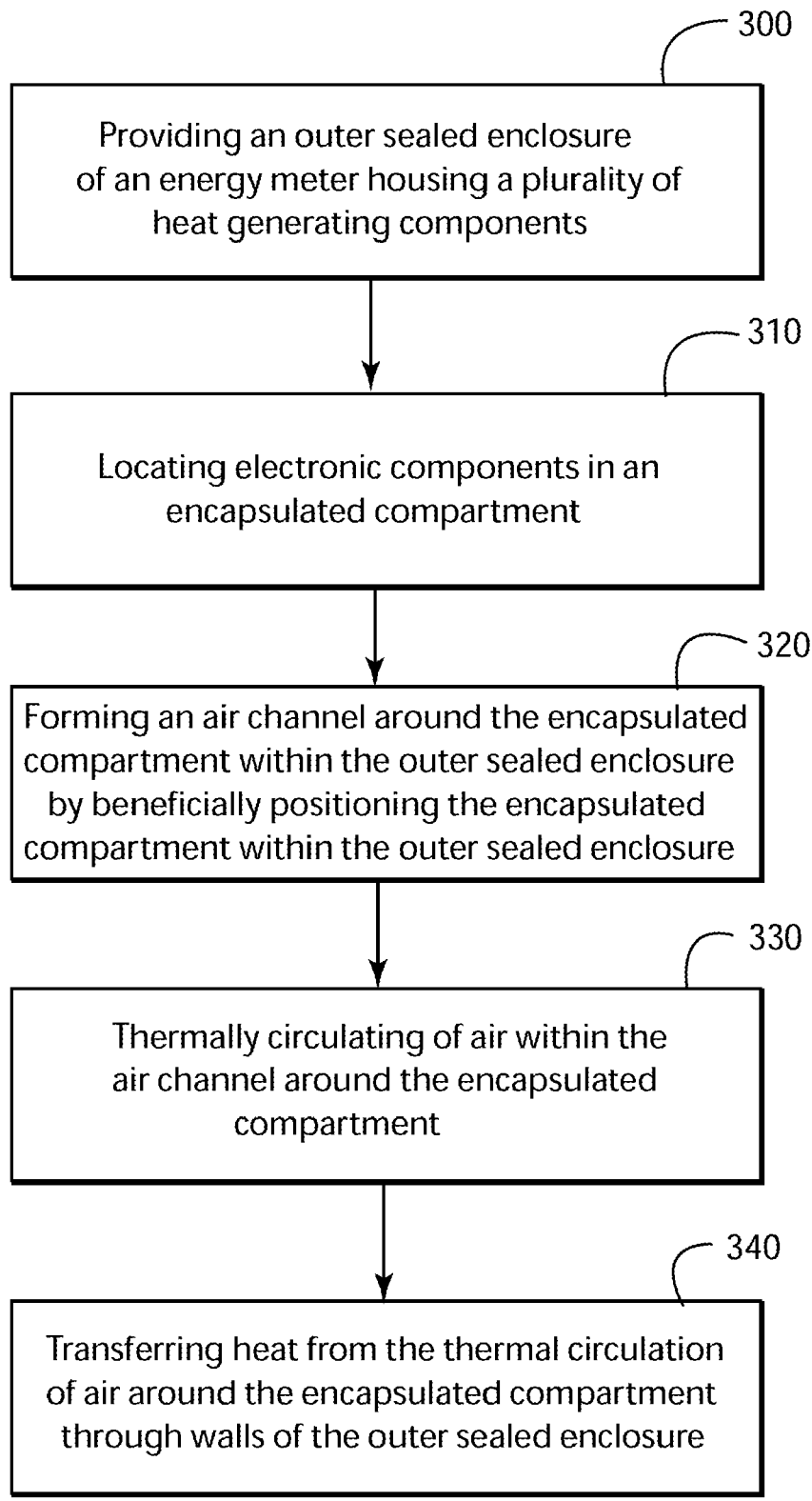

HEAT MANAGEMENT AND REDUCTION OF HIGH TEMPERATURES EXPOSURE TO COMPONENTS INSIDE ENERGY METER

BACKGROUND OF THE INVENTION

The invention relates generally to electric metering devices and more specifically to heat management for electronics within such devices.

Traditional utility meters for the measurement of electricity primarily employed mechanical registers and devices. While electricity meters always contained devices that sense electrical energy, the registration of such sensed energy was often carried out mechanically using gears and dials. More recently, utility meters have increasingly relied upon electronic circuits that provide enhanced functionality. At present, electricity meters often contain one or more circuit boards that provide advanced consumption registration functions, automatic meter reading functions, diagnostics, profiling and other beneficial functions.

A problem sometimes encountered with utility meters that employ electronic circuits is excessive temperature rise inside the cover of the meter due to heat generated by electronic components and by other electrical components within the meter. As internal temperature rises, the life expectancy of the electronic components is reduced. Consequently it is desirable to limit the increase in temperature in the area of electronic components. Unfortunately, electric meters must be enclosed in such a manner as to pass the metering industry's weatherization standards, which require meter enclosures to be sealed from dust and water. Such weathering requirements prevent the addition of air vents or other traditional means of reducing internal temperature rise of electronic devices.

As a consequence, the amount and/or functionality of electronic circuitry within meters may be limited at least partly by the associated heat rise caused by additional circuitry and/or functionality. Limiting functionality is important because the same component, such as a processor, can generate more or less heat based on its usage.

Accordingly, it would be desirable to provide advanced functionality associated with contemporary electronics, while maintaining ambient conditions for electronic devices within the utility meter enclosure at an appropriate level for sustaining rated life of the electronic components.

BRIEF DESCRIPTION OF THE INVENTION

Briefly in accordance with one aspect of the present invention, a structure for controlling heat removal from an electrical energy meter is provided. The structure includes a base assembly with external walls including an open face. Multiple heat generating electrical components are mounted in an internal space of the base assembly. Electronic modules are provided for metrology and display. A fully encapsulated compartment housing is provided for the electronic modules. The encapsulated compartment is mounted within the internal space of the base assembly. An outer cover is mounted to the open face of the base assembly forming an airtight enclosure around the internal space. An arrangement is provided for natural air circulation removing heat from the heat generating components around the encapsulated compartment to the exterior surfaces of the electrical energy meter.

According to a second aspect of the present invention, a method is provided for maintaining safe operating temperatures for electronic components of a sealed electric utility meter housing heat-generating components. The method includes providing an outer sealed enclosure housing a plurality of heat generating components. Electronic components are located in an encapsulated compartment within the outer sealed enclosure. The encapsulated compartment is positioned within the outer sealed enclosure to advantageously form air channels between the encapsulated compartment and an outer surface of the outer sealed enclosure. The method further includes thermally circulating of air within the air channel around the encapsulated compartment and the outer surface of the outer sealed enclosure and transferring sufficient heat from the thermal circulation of air around the encapsulated compartment through walls of the outer sealed enclosure to provide safe operating temperatures for the electronic components.

BRIEF DESCRIPTION OF THE DRAWING

These and other features, aspects, and advantages of the present invention will become better understood when the following detailed description is read with reference to the accompanying drawings in which like characters represent like parts throughout the drawings, wherein:

FIG. 3 illustrates a flowchart for a method of maintaining safe operating temperatures for electronic components of a sealed electric energy meter housing heat-generating components.

DETAILED DESCRIPTION OF THE INVENTION

The following embodiments of the present invention have many advantages, including mounting encapsulated of electronic components of the utility meter within a sealed outer enclosure with air channels between the encapsulated electronic components and the sealed outer enclosure to deliver sufficient thermal air circulation there-between promoting sufficient heat transfer through an outer skin of the sealed outer enclosure for maintaining acceptable thermal conditions for the encapsulated electronic components.

Figure 1:
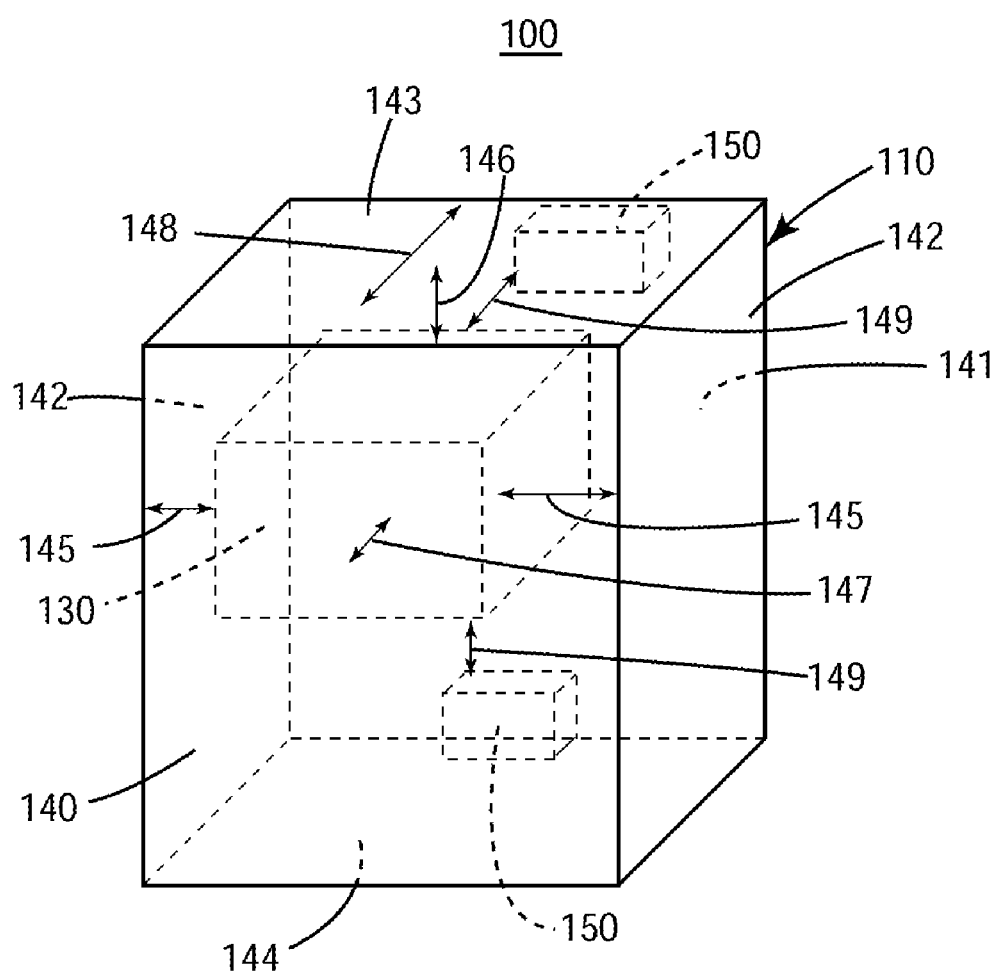
FIG. 1 illustrates a simplified view of an inventive energy meter.

FIG. 1 illustrates a simplified view of an inventive energy meter 100 that includes an outer sealed enclosure 110, an encapsulated compartment 130 for housing electronic components (not shown), and a plurality of high heat generating components 150. The outer sealed enclosure 110 includes a front wall 140, a back wall 141, sidewalls 142, a top surface wall 143 and a bottom surface wall 144. The encapsulated compartment 130 housing the electronics is mounted within the outer sealed enclosure 110 in a manner to allow for channels to accommodate thermally circulating air for transfer of heat largely from the heat generating components 150 through the outer surfaces of the outer sealed enclosure 110. Side channels 145 are provided between the encapsulated compartment 130 and the sidewalls 142. Top channel 146 is provided between the encapsulated compartment 130 and the top surface 143. Front channel 147 is provided between the encapsulated compartment 130 and front wall 140. Rear channel 148 is provided between the encapsulated compartment 130 and rear wall 141. Channels 149 are also provided between encapsulated compartment and heat generating components 150.

Figure 2:
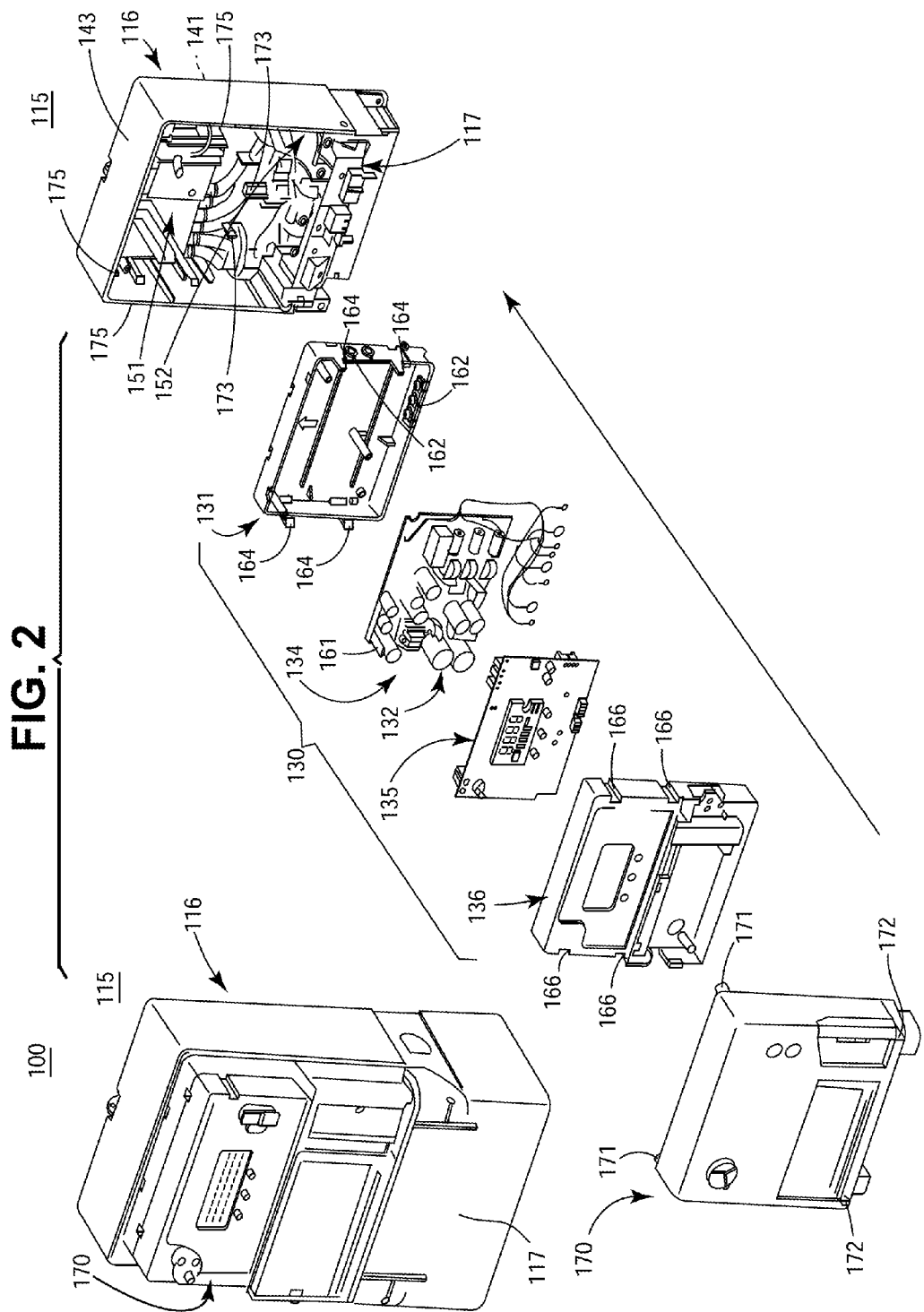
FIG. 2 illustrates an exploded view of the inventive energy meter.

FIG. 2 illustrates an exploded view of the inventive energy meter. The energy meter is a direct connect type with current transformer to measure energy consumption. The meter has a base assembly and encapsulation. The base assembly is installed with devices that generate high heat. Isolation to electronic components is provided through encapsulation. Encapsulation includes an isolating device and a cover that houses electronic modules. Meter architecture is arranged in such a way that it also provides maximum convective surface to exchange heat outside meter.

All components are fitted in an enclosure made of plastic. The metrology compartment is sealed to comply with industry requirements for protection from rain and dust. Meter industry enclosure requirements do not allow the active air circulation or other traditional means of reducing internal temperature rise in energy meter. The electronic components within the energy meter contain components like a microcontroller chip, which has a maximum operating temperature of 85° C. In an extreme operating condition of 70° C. ambient temperature, there is only flexibility of 15° C. rise over operating temperature for functioning of electronics.

Energy meters required for advanced metering infrastructure (AMI) are provided with multiple disconnect devices and advanced electronic modules. The meter also includes current conductors, current transformers & electrical joints. Due to operation of meter at full load, high heat is generated inside meter. A high temperature rise caused by high heat generation inside the meter is detrimental to electronic components. Electronic components degrade rapidly in a high temperature environment within the meter. As per meter industry standards, the meter enclosure is required to be sealed from dust and water. Hence it is not possible to take away heat outside meter by traditional means of temperature reduction.

Base assembly 115 includes an open-faced enclosure 116 with terminal section 117 mounted to bottom of the enclosure 116. Heat generating elements 150 are mounted in the enclosure 116 of base assembly 115. Heat generating elements 150 are electrically connected with electric current circuits inside the enclosure 116 and terminal box 117. The heat generating elements 150 include a three-phase, 100A latching type relay switch 151 and a single-phase, 40A latching type relay switch 152. These heat-generating devices while working at extreme conditions of 70° C. ambient and rated current flowing through the meter, may generate approximately 20 watts of heat at a full load condition. Such a high heat generated inside the meter enclosure causes a high temperature rise within the enclosure.

The electronic modules are encapsulated in a housing formed by an isolator and an inner cover. The isolator 131 is an open-faced enclosure. The electronic modules may include an electronic component board 134 and a meter display board 135. Electrical connection between the boards 134, 135 and components within the base assembly 115 pass through sealed connectors 161 and sealed terminals 162, thereby maintaining the integrity of the encapsulation. The isolator 131 and an inner cover 136 are assembled to each other by plastic snaps, sealing the electronic components 132 within. The isolator 131 may be installed on standoffs 173 extending from the rear wall 141 of the base assembly 115. Snap lock arms 164 on isolator 131 may engage hooks 165 on the inner cover 136 to seal electronic component board 134 and meter display board 135 within. The electronic components 132 may be industrial grade components rated to withstand up to 105° C. However, a processor on metering circuit board is rated to 85° C. Hence internal temperature rise should not exceed 85° C. at extreme operating conditions (full load current and limiting temperature range). Operation below the limiting temperature range ensures reliability of the electronic components and promotes a longer operating life for meter. If temperature rises above 85° C., reliability and revenue data might be lost in some cases. The encapsulation of the electronics does not allow hot air from the base assembly 115 to enter within the isolator compartment 131, thereby protecting electronic components boards 134, 135 from exposure to high temperature from within the base assembly.

An outer cover 170 is assembled to base assembly 115 using hooks 171 and sealing screws 172. Base assembly 115 and outer cover 170 form the sealed meter enclosure along edges 175 of the base assembly. Snap lock arms 174 on the base assembly 115 engage hooks 171 on the outer cover 170 sealing the interface and providing protection from dust and water.

The base assembly 115 is mounted in vertical condition in field application. Due to relative air density, hot air inside meter flows towards the top side 143 of enclosure, circulating around the encapsulated compartment 130. As described with respect to FIG. 1, channels are provided between the encapsulated compartment 130 and the outside walls of the sealed enclosure 110. The encapsulated compartment is mounted within the meter so as to provide channels for air flow around all sides and above and below, thus providing maximum surface area for convective heat exchange with outside ambient.

FIG. 3 illustrates a flowchart for a method of maintaining safe operating temperatures for electronic components of a sealed electric energy meter housing heat-generating components. Step 300 provides an outer sealed enclosure housing a plurality of heat generating components. Step 310 locates a plurality of electronic components in an encapsulated compartment. Step 320 includes forming an air channel around the encapsulated compartment within the outer sealed enclosure by beneficially positioning the encapsulated compartment within the outer sealed enclosure. Step 330 thermally circulates of air within the air channel around the encapsulated compartment. Step 340 transfers heat from the thermal circulation of air around the encapsulated compartment through walls of the outer sealed enclosure.

While various embodiments are described herein, it will be appreciated from the specification that various combinations of elements, variations or improvements therein may be made, and are within the scope of the invention.

The invention claimed is:

1. A structure controlling heat removal from an electrical energy meter, the structure comprising:
    a base assembly with external walls including an open face;
    a plurality of heat generating electrical components mounted in an internal space of the base assembly;
    electronic modules for metrology and display;
    a fully encapsulated compartment housing the electronic modules and mounted within the internal space of the base assembly, wherein the encapsulated compartment comprises:
        an isolator housing;
        the electronics modules mounted within the housing;
        a display module mounted within the housing; and
        an inner cover mounted to the housing over the display module;
    an outer cover mounted to the open face of the base assembly forming an airtight enclosure around the internal space;
    an arrangement for moving heat from said heat generating components and said encapsulated compartment to exterior surfaces of the electrical energy meter; and
    wherein the heat generating components are physically separated from the fully encapsulated compartment.

2. The structure according to claim 1, wherein the arrangement for moving heat comprises: an air channel between the encapsulated compartment and the external walls of the base assembly.

3. The structure according to claim 1, wherein the arrangement for moving heat comprises: an air channel between the encapsulated compartment and the outer cover.

4. The structure according to claim 1, wherein the arrangement for moving heat comprises: an air channel between the encapsulated compartment and the heat generating components.

5. The structure according to claim 3, further comprising a plurality of standoffs projecting from the external wall of the base assembly wherein the plurality of standoffs position the encapsulated compartment to form an air channel between the encapsulated compartment and the heat generating components and between the encapsulated compartment and the external wall of the base assembly.

6. The structure according to claim 1, wherein the base assembly further comprises a plurality of snap hooks wherein the isolator housing is locked onto the base assembly with the plurality of snap hooks.

7. The structure according to claim 6, wherein the isolator housing further comprises a plurality of plastic snaps wherein the inner cover is installed on the isolator housing with the plurality of plastic snaps.

8. The structure according to claim 1, wherein the encapsulated compartment comprises an electrical insulator.

9. The structure according to claim 5, wherein the heat generating components raise temperature of air in the base assembly creating thermal air circulation flowing around and above the encapsulated compartment in thermal communication with the external walls of the base assembly and with the outer cover promoting heat transfer to ambient air.

10. The structure according to claim 2, wherein the heat generating components raise temperature of air in the base assembly creating thermal air circulation flowing around and above the encapsulated compartment in thermal communication with the external walls of the base assembly and with the outer cover promoting heat transfer to ambient air.

11. The structure according to claim 4, wherein the heat generating components raise temperature of air in the base assembly creating thermal air circulation flowing around and above the encapsulated compartment in thermal communication with the external walls of the base assembly and with the outer cover promoting heat transfer to ambient air.

12. The structure according to claim 6, wherein the encapsulated compartment comprises an electrical insulator.

13. The structure according to claim 7, wherein the encapsulated compartment comprises an electrical insulator.

* * * * *